(12) United States Patent
Ehm et al.

(10) Patent No.: US 8,546,776 B2
(45) Date of Patent: Oct. 1, 2013

(54) OPTICAL SYSTEM FOR EUV LITHOGRAPHY WITH A CHARGED-PARTICLE SOURCE

(71) Applicant: Carl Zeiss SMT GmbH, Oberkochen (DE)

(72) Inventors: Dirk Heinrich Ehm, Lauchheim (DE); Markus Weiss, Aalen (DE); Christoph Zaczek, Heubach (DE); Tobias Hackl, Langenau (DE); Wolfgang Seitz, Rainau (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 13/713,978

(22) Filed: Dec. 13, 2012

(65) Prior Publication Data

US 2013/0099132 A1    Apr. 25, 2013

Related U.S. Application Data

(63) Continuation of application No. PCT/EP2011/059793, filed on Jun. 14, 2011.

(60) Provisional application No. 61/354,558, filed on Jun. 14, 2010.

(30) Foreign Application Priority Data

Jun. 14, 2010   (DE) .......................... 10 2010 030 023

(51) Int. Cl.
      *G21K 5/04*   (2006.01)
(52) U.S. Cl.
      CPC ....................... *G21K 5/04* (2013.01)
      USPC ........................................ 250/504 R
(58) Field of Classification Search
      USPC .............................................. 250/504 R, 251
      See application file for complete search history.

(56) References Cited

U.S. PATENT DOCUMENTS

| | | | |
|---|---|---|---|
| 6,642,531 B1 | 11/2003 | Powers | |
| 7,015,468 B1 | 3/2006 | Azordegan et al. | |
| 8,164,077 B2 * | 4/2012 | Wedowski et al. | 250/504 R |
| 2005/0205800 A1 | 9/2005 | Barnard et al. | |
| 2006/0219950 A1 | 10/2006 | Bakker et al. | |
| 2008/0304031 A1 | 12/2008 | Kanehira et al. | |
| 2010/0112494 A1 | 5/2010 | Kraus et al. | |
| 2011/0043774 A1 | 2/2011 | Hembacher et al. | |

FOREIGN PATENT DOCUMENTS

| | | |
|---|---|---|
| DE | 102007057252 A1 | 9/2008 |
| DE | 102008000709 B3 | 11/2009 |
| WO | 2004107055 A2 | 12/2004 |

* cited by examiner

*Primary Examiner* — Kiet T Nguyen
(74) *Attorney, Agent, or Firm* — Sughrue Mion, PLLC

(57) ABSTRACT

To prevent reflective optical elements (2) for EUV lithography from becoming electrically charged as they are irradiated with EUV radiation (4), an optical system for EUV lithography is proposed, having a reflective optical element (2), including a substrate (21) with a highly reflective coating (22) emitting secondary electrons when irradiated with EUV radiation (4), and a source (3) of electrically charged particles, which is arranged in such a manner that electrically charged particles are applied to the reflective optical element (2), wherein the source (3) for the charge carrier compensation is exclusively a flood gun applying electrons to the reflective optical element (2).

11 Claims, 4 Drawing Sheets

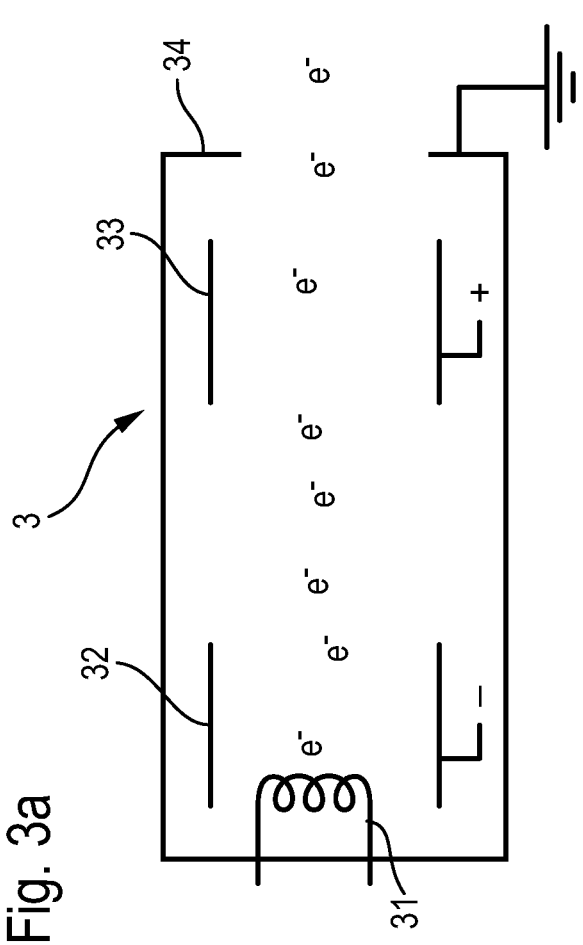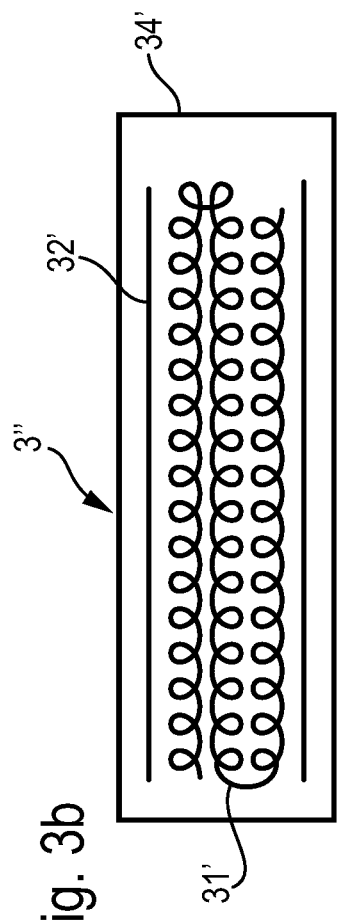

OPTICAL SYSTEM FOR EUV LITHOGRAPHY WITH A CHARGED-PARTICLE SOURCE

This is a Continuation of International Application PCT/EP2011/059793, with an international filing date of Jun. 14, 2011, which was published under PCT Article 21(2) in English, and which, in turn, claims priority to DE 10 2010 030 023.3 and U.S. 61/354,558, both of which were filed on Jun. 14, 2010. The complete disclosures of all three parent applications are incorporated into this Continuation by reference in their entireties.

FIELD OF AND BACKGROUND OF THE INVENTION

The present invention relates to an optical system for EUV lithography, comprising a reflective optical element, including a substrate with a highly reflective coating emitting secondary electrons when irradiated with EUV radiation, and a source of electrically charged particles, which is arranged in such a manner that electrically charged particles can be applied to the reflective optical element. Moreover, the present invention relates to an illumination system for EUV lithography, a projection system for EUV lithography, and an EUV lithography apparatus having such an optical system.

In EUV lithography, for the lithography processing of semiconductor elements, reflective optical elements are used for the soft X-ray to extreme ultraviolet (EUV) wavelength ranges (e.g. wavelengths between about 5 nm and 20 nm) such as for photomasks or multilayer mirrors. Since EUV lithography apparatuses usually have several optical elements, they have to have the highest possible reflectivity to ensure sufficient overall reflectivity. Since a plurality of optical elements are usually arranged in series in an EUV lithography apparatus, even the slightest deterioration in reflectivity of any one optical element has severe repercussions for the overall reflectivity within the EUV lithography apparatus.

In the operation of EUV lithography apparatuses, reflective optical elements are exposed to as intense an EUV radiation as possible to keep exposure times as short as possible. In the interior of EUV lithography apparatuses, in particular in the interior of illumination and projection systems, vacuum conditions prevail. However, very small proportions of water, oxygen and hydrocarbons cannot be entirely eliminated in the residual gas atmosphere. These residual gases may be split into reactive fragments by the radiation, which can lead to contamination and deterioration of the surface of the highly reflective coating of the reflective optical elements. These reactive fragments can be generated either directly by the EUV radiation or by secondary electrons generated by EUV radiation. Two important processes, which corrode the surface of the reflective optical elements, are the oxidation due to the dissociation of adsorbed water molecules, and the growth of carbon layers due to the dissociation of adsorbed hydrocarbon molecules. Both processes can be caused by photo-emitted secondary electrons. The actual maximum reflectivity of each of the reflective optical elements can be reduced by the contamination or oxidation of the top layer.

A common way to clean contaminated surfaces of reflective optical elements is to provide them with hydrogen radicals and ions. From U.S. Pat. No. 6,642,531 B1 it is known to remove particles from surfaces of reflective optical elements by providing a charge to them by showering them with electrons and moving them away from the reflective surface by electrostatic elements.

To reduce the influence of the secondary electrons, electrode arrangements are known in which the reflective optical element is connected as the first electrode, and a second electrode is arranged at a distance from the irradiated surface of the reflective optical element to remove any produced secondary electrons before they contribute to carbon contamination or oxidation of the reflective optical element.

Another approach to reduce the influence of the secondary electrons is to earth the reflective optical elements to prevent the surface of the reflective optical element from being uncontrollably electrically charged. Electrical charging has the drawback that the charged surface attracts electrically charged fragments having the opposite electrical charge, which can lead to sputtering effects on the surface of the reflective optical elements. To achieve earthing of reflective optical elements for EUV lithography, wherein a substrate is provided with a highly reflective coating, either the highly reflective coating or the substrate can be contacted to achieve charge carrier compensation. If, however, the substrate partially or wholly consists of an insulating or poorly conductive material, sufficient charge carrier compensation cannot occur to avoid electrically charging the optical surface.

OBJECTS AND SUMMARY OF THE INVENTION

It is an object of the present invention to provide an optical system for EUV lithography, which ensures sufficiently high maximum reflectivities in use over an extended period of time.

This object is achieved by an optical system for EUV lithography, comprising a reflective optical element, including a substrate with a highly reflective coating emitting secondary electrons when irradiated with EUV radiation, and a source of electrically charged particles, which is arranged in such a manner that electrically charged particles are applied to the reflective optical element, wherein the source is a flood gun applying electrons to the reflective optical element as the sole charge carrier compensation source. In other words, the optical system includes no further mechanism other than the flood gun for effecting charge carrier compensation.

The charge carrier source is a so-called flood gun, sometimes also referred to as a flood source to compensate for charge differences caused by secondary electrons emitted by the irradiated surface of the reflective optical element under the influence of the EUV radiation. Flood guns are specially configured electron sources, commercially available in various forms, in which both the energy of the electrons and the electron flow as a whole can be very precisely adjusted in the range from 0 eV to 100 eV, in some cases also beyond that. Moreover, they emit an unfocused electron beam in order to achieve as complete and homogeneous an application as possible of electrically charged particles to the surface illuminated by the EUV radiation. Local charging effects and thus local sputtering effects due to electrically charged reactive fragments attracted by it or accelerated towards it, are thereby effectively prevented, such that nothing further for charge carrier compensation of emitted secondary electrons from the reflective optical element, when irradiated with EUV radiation, is needed.

Since the charge carrier source is configured as a source of low-energy electrically charged particles, this reduces the probability that the introduced electrically charged particles themselves can lead to sputtering effects as they impinge on the surface of the reflective optical element, to which electrically charged particles are applied.

The energy of the electrons provided by the flood gun is advantageously adjusted in such a manner that, at a maximum, it corresponds respectively to the energy of the EUV radiation used. The energy range from 0 eV to 100 eV corresponds to the use of EUV radiation in the area of about 13.5 nm, i.e. the wavelength range most commonly used in EUV lithography. The energy range is thus acceptable for smaller wavelengths as well, such as around 7 nm, for example. Preferably the electrically charged particles have an energy in the range from about 10 eV to 40 eV or even less in order to effectively reduce any sputtering effects and, at the same time, to provide for sufficient charge carrier compensation.

A major advantage of using a flood gun as source for electrically charged particles is that it provides an unfocused particle beam. Preferably, the particle beam is expanded in such a manner that, for charge carrier compensation, electrically charged particles are applied to as large a portion as possible of the surface irradiated with EUV radiation of the reflective optical element. In a further variant, the irradiated surface is scanned by the particle beam in order to achieve as homogeneous a charge carrier compensation as possible across the surface. In this way, local charges can be avoided, which could otherwise lead to sputtering effects due to reactive fragments.

It has been found that providing a dedicated source of electrically charged particles such as a flood gun allows for the controlled and timely application of electrically charged particles to the reflective optical element. The charging processes due in particular to secondary electrons, and/or electrically charged reactive fragments in the residual gas atmosphere can thus be counteracted. By applying electrons to the reflective optical element in a controlled manner at the same time or close to the time of irradiation with EUV radiation, the application of electrons can ensure sufficient charge carrier compensation to prevent sputtering effects on the surface of the reflective optical element by electrically charged fragments, such as ionized residual gases. A high, uniform reflectivity of the reflective optical element can thus be ensured over long operation periods in the context of an EUV lithography process. Herein, the charge carrier compensation is independent of the material properties of the substrate or the highly reflective coating. The suggested optical system can thus have, in particular, reflective optical elements with substrates of a material having resistivities higher than 1 kΩ, as is the case, for example, with the widely used substrate materials on the basis of glass-ceramics or titanium-doped quartz glass. In particular, no furthercharge carrier compensation, such as e.g. through electrical grounding is necessary, thus providing for a quite simple and compact optical system, one that is easy to install in various EUV lithography apparatus.

In preferred embodiments, the highly reflective coating is based on a multilayer system. It is to be noted that a highly reflective coating is a coating providing for maximum reflectivities of 50% or more for a sub-range of the wavelength range of 5 nm to 20 nm, while showing substantially smaller maximum reflectivities for wavelengths outside of the sub-range of 5 nm to 20 nm. In particular, for a sub-range around 13.5 nm, even maximum reflectivities of larger than 60%, in particular larger than 65% are commonly reached with highly reflective coatings optimized for normal incidence of the EUV radiation and based on multilayer systems, e.g. repeatedly alternatingly arranged layers of silicon and molybdenum. For wavelengths between 1 nm to 12.5 nm or 15 nm to 20 nm, they show maximum reflectivities near zero. Multilayer systems are essentially comprised of multiple repetitive stacks of so-called spacer layers of a material having a higher real part of the refractive index, and so-called absorber layers of a material having a lower real part of the refractive index, at the wavelength at which EUV lithography is carried out. This essentially simulates a crystal, wherein the absorber layers correspond to the lattice planes within the crystal, the distance between them being defined by the respective spacer layers, on which Bragg reflection of incident EUV radiation occurs. Making use of multilayer systems with various combinations of materials allows the skilled artisan to provide highly reflective coatings optimized for any wavelength in the EUV wavelength range.

Preferably the flood gun is arranged in such a manner that the electrons are applied to only the border of the highly reflective coating of the reflective optical element, which is primarily exposed to the EUV radiation. By applying electrons to the border of the surface of the reflective optical element having a highly reflective coating, from which secondary electrons may be emitted, for example, due to the effect of radiation, efficient charge carrier compensation can be achieved already with weak particle flows without impeding the EUV irradiation during the lithography process. Furthermore the risk of degrading the highly reflective coating with the electrons provided by the flood gun is further minimized.

Advantageously, the flood gun is arranged in such a manner that the electrons are applied exclusively to the border of the highly reflective coating of the reflective optical system to provide a most efficient, rapid and homogeneous charge carrier compensation with respect to the highly reflective coating.

In preferred embodiments, the flood gun is arranged to apply electrons to a surface of the reflective optical system with an angle larger than 45° to the surface normal. Due to this grazing incidence of the electrons, a large footprint can be generated on the surface onto which the electrons are applied. This increases the effect of the unfocused electron beam provided by flood guns. Moreover, the unfocused electron beam, if needed, can be additionally expanded, for example, through the use of electromagnetic fields in order to achieve as complete and homogeneous an application as possible of electrically charged particles to the surface illuminated by the EUV radiation.

Flood guns can be based on two different principles to produce electron beams. Thermionic flood guns show electron emission through heating of a heating element, e.g. a filament of a refractory material such as tungsten or lanthanum hexaboride. Field emission flood guns show electron emission through applying an extraction voltage to some material. In preferred embodiments, the flood gun is a thermionic flood gun with a heating element, the heating element being a planar element. Providing a heating element extending in two dimensions enhances the possibilities to apply electrons in a homogeneous way to the reflective optical element.

Advantageously, the optical system comprises at least one further optical element, to which preferably electrically charged particles from the particle source can also be applied, and/or at least one further reflective optical element to apply electrons in a more homogeneous way to the reflective optical element.

Furthermore, the object is achieved by any or all of an illumination system for EUV lithography, a projection system for EUV lithography, and an EUV lithography apparatus having an optical system such as the one just described. Since they are equipped with optical systems which prevent charging at one or more of their reflective optical elements by providing effective charge carrier compensation and noticeably reduce the risk of sputtering effects on the surface of the reflective optical elements, they exhibit better stability in their optical functioning, in particular with respect to the reflectivities of the reflective optical elements, over longer periods of operation. As a result, in turn, the throughput rates of the relevant lithography process can be kept at a higher level over longer periods of operation.

Advantageous embodiments are defined in the dependent claims.

BRIEF DESCRIPTION OF THE DRAWINGS

The present invention will be explained in more detail with reference to preferred exemplary embodiments, wherein:

FIGS. 3a,b schematically show two examples of the structure of a flood gun.

DETAILED DESCRIPTION OF EXEMPLARY EMBODIMENTS

Figure 1:
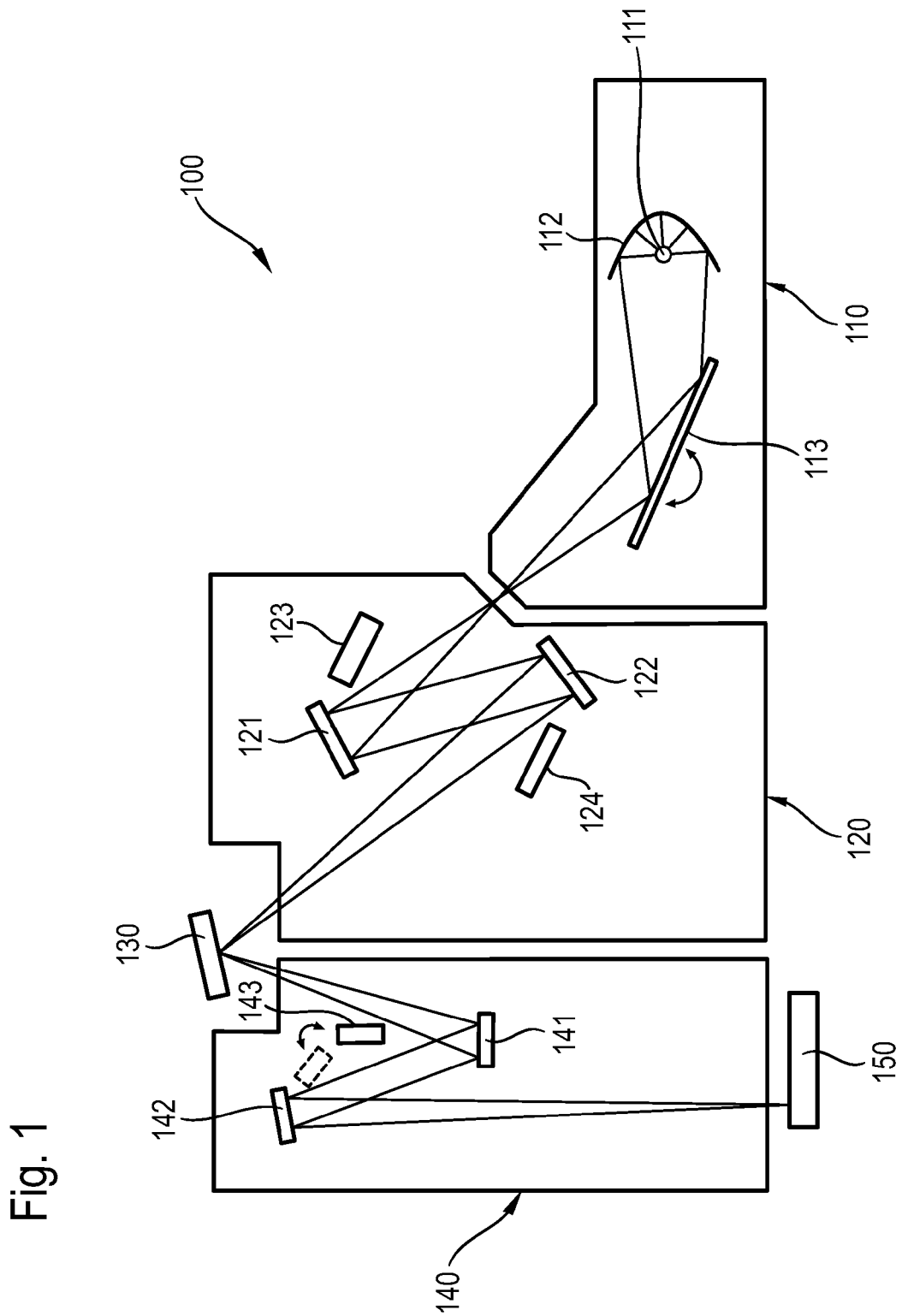
FIG. 1 schematically shows an embodiment of an EUV lithography apparatus comprising optical systems.

FIG. 1 schematically shows an example of an EUV lithography apparatus 100. Important components are the beam shaping system 110, the illumination system 120, the photomask 130 and the projection system 140. In further variants, the beam shaping system 110 can be wholly or partially integrated into illumination system 120.

A plasma source, or even a synchrotron, can serve as a beam source 111 for the wavelength range from 5 nm to 20 nm. The emitted radiation is first focused by a collector mirror 112. Moreover, the desired operating wavelength is filtered out with the aid of a monochromator 113 by varying the incident angle. In the wavelength range mentioned above, collector mirror 112 and monochromator 113 are usually formed as reflective optical elements.

The operating beam processed in beam shaping system 110 with respect to its wavelength and spatial distribution, is introduced into illumination system 120. In the example shown in FIG. 1, illumination system 120 has two mirrors 121, 122 which, in the present example, are formed as multilayer mirrors comprising, on a substrate, a highly reflective coating based on a multilayer system. Mirrors 121, 122 guide the beam to photomask 130, which has the structure to be imaged onto wafer 150. Photomask 130 is also a reflective optical element for the EUV wavelength range, which is replaced depending on the manufacturing process. With the aid of projection system 140 the beam reflected by photomask 130 is projected onto wafer 150, thus imaging the structure of the photomask onto the wafer. Projection system 140, in the example shown, has two mirrors 141, 142, also formed as multilayer mirrors in the present example. It should be noted that both projection system 140 and illumination system 120 can also have one, or three, four, five or more mirrors.

In the example shown in FIG. 1, both illumination system 120 and projection system 140 comprise an optical system for EUV lithography, with an optical element comprising a substrate with a highly reflective coating, and a source of electrically charged particles, which is arranged in such a manner that electrically charged particles are applied to the reflective optical element, wherein a flood gun applying electrons to the reflective optical element is the exclusive charge carrier compensation source.

In the example shown in FIG. 1, illumination system 120 has two optical systems comprising flood guns 123, 124 as particle sources and reflective optical elements 121, 122. In the example shown here, particle source 123 is arranged in such a manner that electrically charged particles such as electrons can be applied to the surface of mirror 121 illuminated by EUV radiation for charge carrier compensation, while particle source 124 is arranged in such a manner that electrically charged particles can be applied to mirror 122. In the present example, particle sources 123, 124 are configured as flood guns providing low-energy electrons, having energies in the range from 10 eV to 40 eV or less. Sensors for measuring the charge state can be present on mirrors 121, 122. These sensors can be coupled to particle sources 123, 124, so that the flow of the emitted electrons can be varied in dependence on the charge state of the respective mirrors 121, 122. Thus, any intensity fluctuations in the EUV beam can be compensated, which could otherwise lead to the generation of more or less secondary electrons or photoelectrons. This results in a particularly controlled and timely charge carrier compensation using only the respective flood gun 123, 124 in the mirrors 121, 122 to which the electrons are applied.

In projection system 140, in the example shown here, a flood gun as particle source 143 is provided, which is arranged in such a manner that the electrons as electrically charged particles emitted by it impinge on the surface of mirror 141 illuminated by EUV radiation. In the example shown here, the source 143 is a moveably arranged flood gun, so that the orientation of particle source 143 can be changed as needed so that electrically charged particles can also be applied to the illuminated surface of mirror 142 in order to also achieve charge carrier compensation on mirror 142 if needed. To optimize the functioning of this special variant of an optical system comprising a particle source 143 and two mirrors 141, 142, a sensor can be mounted on each of mirrors 141, 142 for determining the current charge state of each mirror 141, 142. This sensor is preferably coupled to a control apparatus of particle source 143, which adjusts the orientation of particle source 143 so that electrically charged particles are selectively applied to that mirror 141, 142 which exceeds a certain predetermined charge threshold. Since the impinging EUV radiation intensity decreases as it progresses from one mirror to the next in the beam path, in the example shown in FIG. 1, such a threshold is reached sooner by mirror 141, upstream in the beam path, than by mirror 142. Thus, with a constant particle flow from source 143, on average electrically charged particles will be applied to mirror 141 for longer.

It should be noted that both in the illumination system and in the projection system, each mirror can be optionally equipped with its own flood gun, with the aid of which electrons can be applied to two, three, four or more mirrors, or mirrors can be provided that are arranged in the beam path in addition to the optical systems mentioned here, to which electrically charged particles are, however, not applied. Furthermore, optical elements 112, 113 of beam shaping system 110, or mask 130, could also be equipped with one or more particle sources, to provide them with charge carrier compensation. Also, mirrors having a particularly large illuminated area could be provided with more than one particle source to ensure that the surface is provided with as homogeneous an application of electrically charged particles as possible.

Figure 2A:
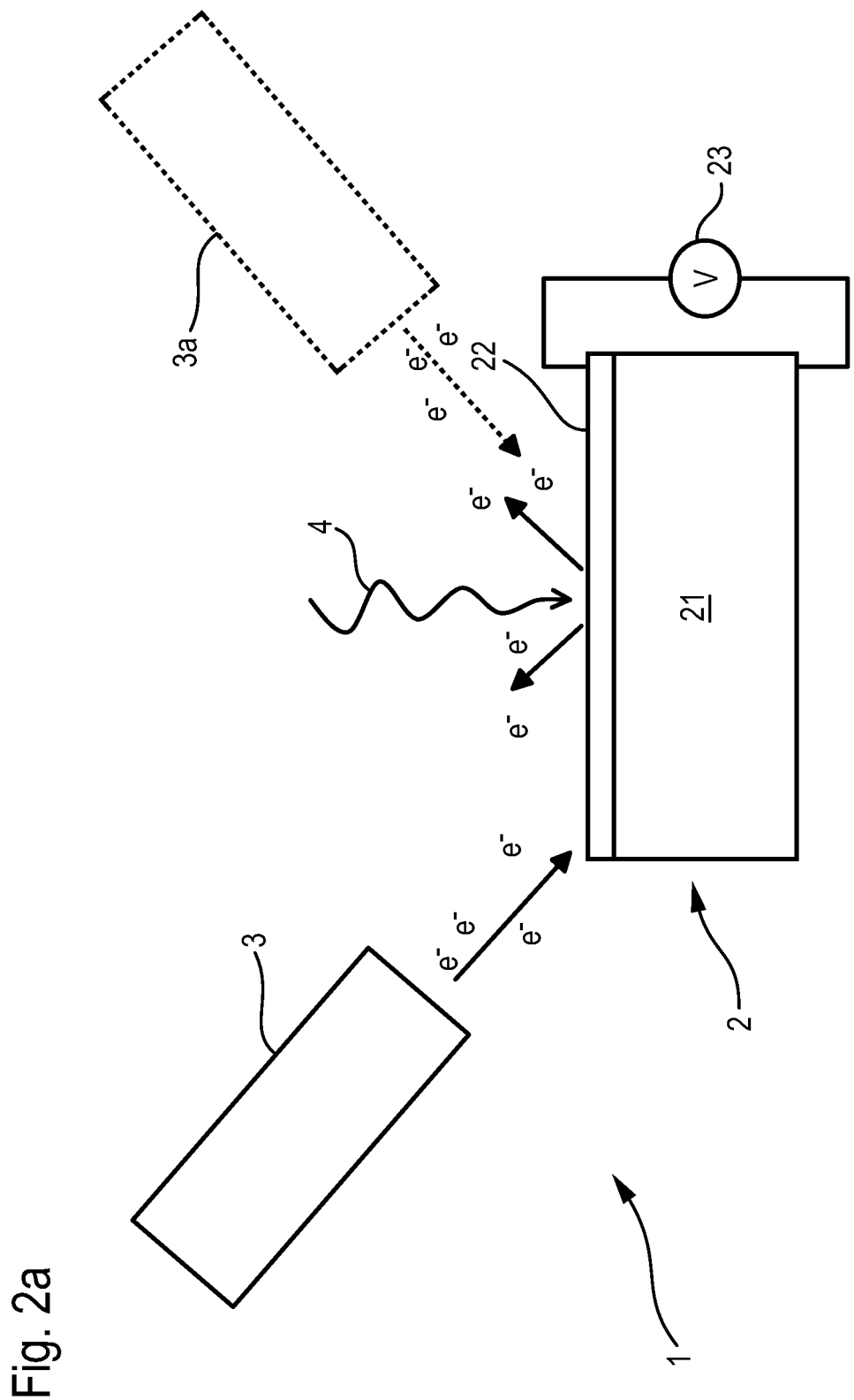
FIG. 2a schematically shows the structure of a first embodiment of an optical system.

FIG. 2a shows an optical system 1 in an exemplary manner, comprising a reflective optical element 2 and a source 3 of electrically charged particles formed, in the present example, as an electron source. Reflective optical element 2 comprises a substrate 21 of glass-ceramics having a particularly low thermal expansion coefficient, with a resistance of more than 1 kΩ. The side of this substrate 21 which, in the context of EUV lithography, is primarily exposed to EUV radiation 4, is provided with a highly reflective coating 22 based on a multilayer system.

The multilayer system of the highly reflective coating 22 is essentially comprised of multiple repetitive stacks of so-called spacer layers of a material having a higher real part of the refractive index, and so-called absorber layers of a material having a lower real part of the refractive index, at the wavelength at which EUV lithography is carried out. This essentially simulates a crystal, wherein the absorber layers correspond to the lattice planes within the crystal, the distance between them being defined by the respective spacer layers, on which Bragg reflection of incident EUV radiation occurs.

In the example shown in FIG. 2a, the highly reflective coating 22 extends across the entire surface of the reflective optical element 2, facing the impinging radiation 4. In variants, only part of this surface may be provided with a reflective optical coating 22 as shown in FIG. 2c. Advantageously, the surface area of the highly reflective coating 22 is at least as large as the area illuminated by the EUV radiation.

To achieve controlled charge carrier compensation, optical system 1, in the example shown in FIG. 2a, has an electron source 3 arranged in such a manner relative to reflective optical element 2 that electrons from electron source 3 are applied to highly reflective coating 22 irradiated by EUV radiation 4. Preferably, the electron beam emitted by electron source 3 is adjusted in such a manner that the charging caused by the emitted secondary or photoelectrons is compensated with the highest possible precision. The electron beam necessary for this can be obtained from test measurements and/or calculations taking into account, inter alia, the EUV radiation intensity and the effective cross-section for the generation of secondary electrons.

To achieve as homogeneous a charge carrier compensation as possible across the irradiated surface, the electron beam is expanded in the example shown here and is applied under angle of more than 45° to the surface normal of the highly reflective coating 22. Optionally, a second electron source 3a (dotted line) can be added to improve the homogeneity of the application of electrons on the highly reflective coating 22.

To check the charge state, in the example shown in FIG. 2a, a sensor is provided on the reflective optical element for measuring the charge state, for example in the form of a voltage meter 23, for measuring how strongly the surface with the highly reflective coating 22 exposed to EUV radiation 4, of the reflective optical element, is charged relative to substrate 21. Voltage meter 23 can be coupled to a control device (not shown) of electron source 3 in order to increase or decrease the electron flow from electron source 3 in dependence on the current charge state. An advantage of monitoring the charge state in this way is, in particular, that fluctuations in intensity of EUV radiation, which could otherwise lead to different emission rates of the photoelectrons, can be better compensated.

The electron source 3 is a so-called flood gun, sometimes also referred to as a flood source. They are specially configured electron sources, commercially available in various forms, in which both the energy of the electrons and the electron flow as a whole can be very precisely adjusted in the range from 0 eV to 100 eV, in some cases also beyond that. Moreover, they emit an unfocused electron beam which, if needed, can be additionally expanded, for example, through the use of electromagnetic fields in order to achieve as complete and homogeneous an application as possible of electrically charged particles to the surface illuminated by the EUV radiation. Local charging effects and thus local sputtering effects due to electrically charged reactive fragments attracted by it or accelerated towards it, can thereby be effectively prevented, exclusively through the use of the flood gun 3.

Figure 2B:
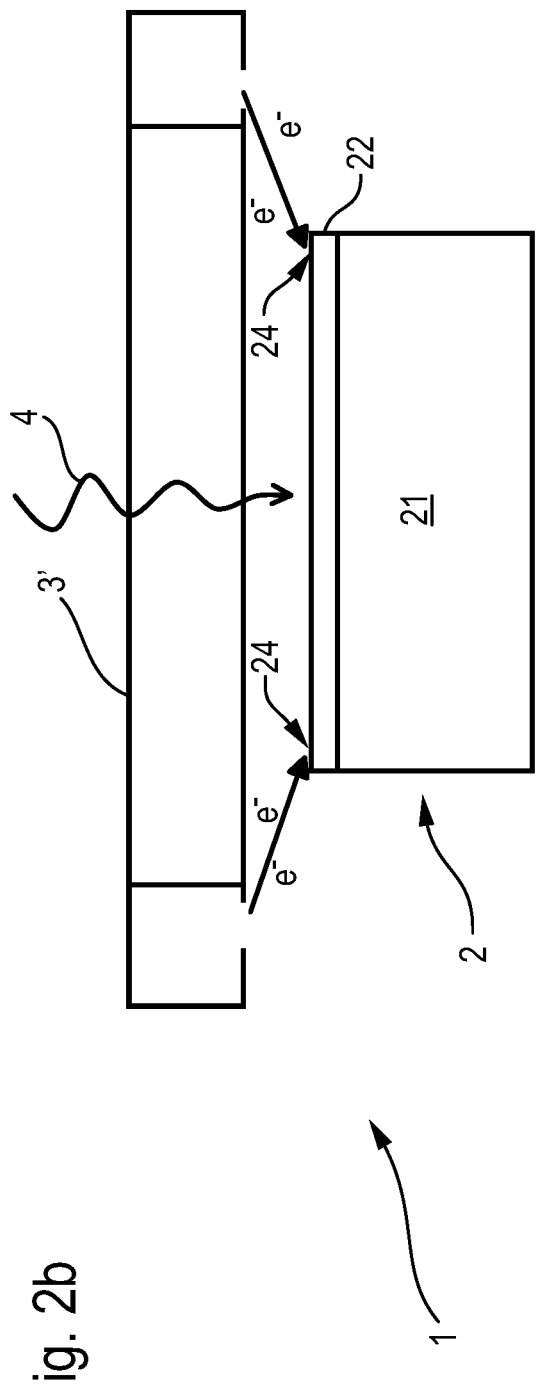
FIGS. 2b,c schematically show the structure of a second embodiment of an optical system.
Figure 2C:
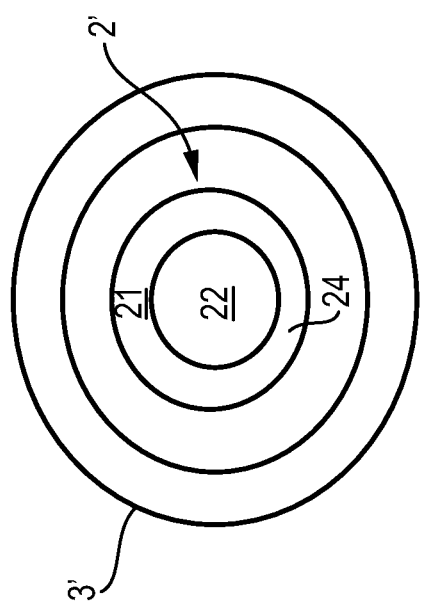

FIGS. 2b,c show a second example of an embodiment of the optical system 1 as sectional view from the side (FIG. 2b) and as view from the top (FIG. 2c). The flood gun 3' according to this example is a thermionic flood gun with a conventional heat filament or a planar heat element arranged as ring around the reflective optical element 2 and emitting electrons at a grazing angle. Such a structure is preferably optimized to apply electrons only to the border 24, while nonetheless completely covering the border 24 of the highly reflective coating 22 on the substrate 21 with electrons at the grazing angle. Thus, the electrons are applied in a most homogeneous way without impeding illumination of the highly reflective coating 22 with EUV radiation 4.

In the variant shown in FIG. 2c, the highly reflective coating 22 does not cover entirely the substrate 21. The border 24, onto which the electrons from the flood gun 3' are applied, is thus partly substrate 21, partly highly reflective coating 22.

FIG. 3a schematically shows a first example of a possible structure of an electron source 3 configured as a flood gun. In the example shown, electrons are generated by a filament 31 by incandescent emission. To influence the intensity of the electron beam, a cylindrical electrode 32 is arranged in direct vicinity to the incandescent filament 31 and provided with a negative electrical potential in relation to filament 31. By adjusting this voltage relative to filament 31, the number of electrons able to bridge the potential is changed. This permits the intensity of the electron beam to be controlled. The electrons emitted by negative electrode 32, are accelerated with a further electrode 33, having a positive electric potential relative to filament 31 and first electrode 32, so that they are emitted from earthed housing 34 with a predefined energy. Positive electrode 33 can also have a cylindrical shape.

The sequence of first the negative and then the positive electrode 32, 33 ensures that the electron beam is not focused. By applying additional electric and/or magnetic fields following positive electrode 33, the electron beam can be additionally flared out if needed, so that electrons can be applied to as large a surface area as possible. In addition, the intensity of the electron flow can also be influenced by the temperature or voltage at filament 31.

In the example shown in FIG. 3b of the flood gun 3", shown as a top view of its interior, the filament 31' is shaped to form a planar heating element extending in two dimensions. The shape of the planar heating element can be adapted to the shape of the reflective optical element or the highly reflective element to which the electrons are to be applied to provide for a highly homogeneous application of the electrons with a large footprint to achieve a particularly effective charge carrier compensation.

Preferably, electrodes 32, 33 and filament 31 are driven such that electron beams result in the order of 1 to 10 μA, or up to 500 μA with particularly strong EUV radiation intensities, in an energy range from 0 eV to 100 eV, preferably 10 eV to 40 eV in some preferred embodiments. In other preferred embodiments one can use e.g. a thermionic flood gun with a tungsten filament providing maximum currents of ca. 1 μA and electron energies around 3 eV to 4 eV, or a thermionic flood gun with a lanthanum hexaboride filament providing maximum currents of ca. 0,5 μA and electron energies around 1,5 eV to 3 eV, or a field emission flood gun providing maximum currents of 0,3 μA and electron energies around 0,4 eV to 1,5 eV. Advantageously, more than one of these latter flood guns are used for applying electrons to one reflective optical element.

The electron beam can be flared in such a manner that it has a diameter of 15 mm to 25 mm, for example, at a distance of 40 mm from the exit from housing 34. If an even larger surface on the reflective optical element is illuminated with EUV radiation, and thus emits secondary electrons, this surface can be scanned by the flared electron beam in order to achieve as homogeneous a charge carrier compensation as possible across the surface. Other possibilities are to increase the incidence angle and make use of two, three, four, five or more flood guns, optionally with planar heating elements. The flood guns are advantageously arranged as a ring around the reflective optical element or the highly reflective coating. All these possibilities may be combined with each other. When applying electrons only to the border around the highly reflective coating, one can work with a smaller footprint than when applying electrons to the whole surface of the highly reflective coating.

If needed, an electron source, as shown in FIG. 3a or 3b in an exemplary manner, can also be modified to a source of other electrically charged particles by introducing gas into housing 34, which is ionized by impulses from the electrons. Suitable electric and/or magnetic fields can ensure that either only the electrons or only the ionized particles or both are emitted from housing 34.

Furthermore, conventional electron guns can be used as electron sources or sources of electrically charged particles with which the illuminated surface can be advantageously scanned to achieve homogeneous charge carrier compensation, or a radioactive source, with a gas to be ionized, as the case may be, in particular if they emit low-energy electrons or other electrically charged particles.

The above description of various embodiments has been given by way of example. From the disclosure given, those skilled in the art will not only understand the present invention and its attendant advantages, but will also find apparent various changes and modifications to the structures disclosed. It is sought, therefore, to cover all such changes and modifications as fall within the spirit and scope of the invention, as defined by the appended claims, and equivalents thereof.

The invention claimed is:

1. An optical system for extreme ultraviolet (EUV) lithography, comprising
    a reflective optical element, including a substrate with a highly reflective coating emitting secondary electrons when irradiated with EUV radiation, and
    a source of electrically charged particles, which is arranged such that electrically charged particles are applied to the reflective optical element,
    wherein the source is a flood gun applying electrons to the reflective optical element as the only charge carrier compensation source.

2. The optical system according to claim 1, wherein the flood gun is arranged to apply the electrons only to a border region of the highly reflective coating of the reflective optical element.

3. The optical system according to claim 1, wherein the flood gun is arranged to apply the electrons to only the border and to cover completely the border of the highly reflective coating of the reflective optical element.

4. The optical system according to claim 1, wherein the flood gun is arranged to apply electrons to a surface of the reflective optical element with an angle larger than 45° to the surface normal.

5. The optical system according to claim 1, wherein the flood gun is a thermionic flood gun with a heating element, the heating element being a planar element.

6. The optical system according to claim 1, wherein the highly reflective coating is a multilayer system.

7. The optical system according to claim 1, further comprising at least one of: at least one further reflective optical element and at least one further electron source.

8. An illumination system for EUV lithography, comprising an optical system according to claim 1.

9. A projection system for EUV lithography, comprising an optical system according to claim 1.

10. An EUV lithography apparatus for EUV lithography, comprising an optical system according to claim 1.

11. An optical system for extreme ultraviolet (EUV) lithography, comprising
    a reflective optical element, including a substrate and a reflective coating emitting secondary electrons when irradiated with EUV radiation, and
    a source of electrically charged particles, configured to apply the electrically charged particles to the reflective optical element,
    wherein the source consists essentially of a flood gun configured to apply electrons as charge carrier compensation for the emitted secondary electrons.

* * * * *

UNITED STATES PATENT AND TRADEMARK OFFICE
CERTIFICATE OF CORRECTION

PATENT NO. : 8,546,776 B2  
APPLICATION NO. : 13/713978  
DATED : October 1, 2013  
INVENTOR(S) : Dirk Heinrich Ehm et al.

Page 1 of 1

It is certified that error appears in the above-identified patent and that said Letters Patent is hereby corrected as shown below:

In the Specification

Column 3, Line 47: delete "furthercharge" and insert -- further charge --

Column 4, Line 20: delete "Furthermore the" and insert -- Furthermore, the --

Column 8, Line 65: delete "0,5 µA" and insert -- 0.5 µA --

Column 8, Line 66: delete "1,5 eV" and insert -- 1.5 eV --

Column 8, Line 67: delete "0,3 µA" and insert -- 0.3 µA --

Column 8, Line 67: delete "0,4 eV" and insert -- 0.4 eV --

Column 9, Line 1: delete "1,5 eV" and insert -- 1.5 eV --

Signed and Sealed this  
Twenty-ninth Day of April, 2014

Michelle K. Lee  
*Deputy Director of the United States Patent and Trademark Office*